United States Patent [19]
Martens et al.

[11] Patent Number: 5,350,739
[45] Date of Patent: Sep. 27, 1994

[54] REFLECTIVE HTS SWITCH

[75] Inventors: Jon S. Martens, Albuquerque; Vincent M. Hietala, Placitas, both of N. Mex.; Gert K. G. Hohenwarter, Madison, Wis.

[73] Assignee: The United States of America as repesented by the United States Department of Energy, Washington, D.C.

[21] Appl. No.: 950,570

[22] Filed: Sep. 24, 1992

[51] Int. Cl.$^5$ ............... H01B 12/02; H01L 39/12; H01P 1/10; H03K 17/92
[52] U.S. Cl. .................. 505/211; 307/245; 505/860; 505/866; 333/262
[58] Field of Search ............ 307/245, 306; 505/1, 505/860, 862, 866; 333/262, 995

[56] References Cited

U.S. PATENT DOCUMENTS

| | | | |
|---|---|---|---|
| 2,989,714 | 6/1961 | Park, Jr. et al. | 307/245 |
| 3,056,889 | 10/1962 | Nyberg | 307/245 |
| 3,141,979 | 7/1964 | Rinia et al. | 307/245 |
| 3,278,808 | 10/1966 | Bonfeld | 307/245 |
| 3,646,363 | 2/1972 | Wright, Jr. | 307/245 |
| 4,963,852 | 10/1990 | Drehman | 307/245 |
| 5,153,803 | 10/1992 | Rapeaux et al. | 307/245 |

OTHER PUBLICATIONS

Track, Hohenwarter, Madhavrao, Patt, Drake, Radparvar, Fabrication and characterization YBCO microstrip delay lines, IEEE Transaction on Magnetics, vol. 27, No. 2, Mar. 1991 pp. 2936-2939.

Newhouse, Mundy, Joynson, and Meiklejohn, Multicrossover Cryotron –a High Gain single Stage Amplifier, The Review of Scientific Instruments, vol. 38, No. 6, Jun. 1967 pp. 790-803.

V. L. Newhouse, Applied superconductivity, pp. 154-169.

Van Duzer, Principles of Superconductive Deviant Circuit, Chapter 5 –The General Josephson Junction: Circuit Applications, pp. 164-243.

*Primary Examiner*—John Zazworsky
*Attorney, Agent, or Firm*—George H. Libman; Gregory A. Cone

[57] ABSTRACT

A HTS switch includes a HTS conductor for providing a superconducting path for an electrical signal and an serpentine wire actuator for controllably heating a portion of the conductor sufficiently to cause that portion to have normal, and not superconducting, resistivity. Mass of the portion is reduced to decrease switching time.

17 Claims, 5 Drawing Sheets

FIG.1

REFLECTIVE HTS SWITCH

The United States Government has rights in this invention pursuant to Contract No. DE-AC04-76DP00789 between the Department of Energy and American Telephone and Telegraph Company.

BACKGROUND OF THE INVENTION

With the advent of very low loss, low dispersion transmission lines made from high temperature superconducting (HTS) materials, e.g., materials that are superconducting at a temperature on the order of 77K, an easily insertable microwave switch becomes an important adjunct component for high performance signal control circuits. Potential applications include switched delay line phase shifters and microwave signal distribution networks. Such a switch would be useful in coplanar waveguides, microstrip lines and a variety of other known transmission systems. A practical device is characterized by low on-state insertion loss, good isolation and switching times on the order of a microsecond for many control applications. Faster switches can be attained with Josephson junction, as disclosed by T. Van Duzer et al., Principles of Superconductive Devices and Circuits, New York: Elsevier, 1981, Chp. 5[4]or flux flow devices, as disclosed by J. S. Martens et al. "Novel applications of Tl-Ca-Ba-Cu-O thin films to active and passive high frequency devices," presented at the 1990 Int. Symp. on Supercond., Sendai, Japan, Nov. 6-9, 1990, and J. S. Martens et al.,"A model and equivalent circuit for a superconducting flux flow transistor," IEEE Trans. on Appl. Supercond., vol. 1: Jun 1991. However, both of these switch types suffer from poor isolation unless they include fairly complicated, and, therefore, expensive, circuitry.

Another known type of switch, semiconductor-based switches, are difficult to integrate with superconductor materials and have insertion losses typically on the order of 2 dB.

SUMMARY OF THE INVENTION

It is an object of this invention to provide a small HTS switch that provides at least 30 dB of isolation and switches in less than 1 $\mu$s.

It is another object of this invention to provide an HTS switch that is thermally activated and magnetically flux flow enhanced.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise a HTS switch including a HTS conductor for providing a superconducting path for an electrical signal and an actuator for controllably heating a portion of the conductor sufficiently to cause that portion to have normal, and not superconducting, resistivity, the switch conducting the signal when the actuator is not heating the portion, and not conducting the signal when the actuator is heating the portion.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

The principle of operation of the HTS switch of this invention is to drive a small thin superconducting bridge into the normal (e.g., not superconducting) state. This operation can be accomplished by heating the bridge by application of heat and a magnetic ;field to the bridge.

The application of a magnetic field has been used before in a low temperature superconducting (LTS) device called the cryotron, as reported by V. L. Newhouse, Applied Superconductivity, New York: Wiley, pp.155–169, 1964, and V. L. Newhouse et al., "Multicrossover Cryotron amplifier," Rev. of Sci. Instr., vol. 38, pp. 798–803: Jun 1967. In the cryotron, the film is driven normal by exceeding a local critical magnetic field. In many of the LTS materials, this critical field to drive the superconductor normal is on the order of a few hundred Gauss or less. Considering demagnetization effects, it is relatively easy to exceed these critical fields with a small current in a nearby superconducting control line.

However, the magnetic fields required to drive HTS materials normal are typically very large (several Tesla), making this known technique impractical for HTS switches. Furthermore, the resultant switching between a superconducting and a mixed, resistive state typically does not provide much isolation.

This invention drives a bridge portion of a HTS conductor normal by locally exceeding the superconductor's critical temperature. A normal metal control line provides heating and, in addition, a local magnetic field. The flux in the bridge is weakly pinned; therefore, a flux-containing mixed state is induced by the magnetic field well before the bridge switches normal. This mixed state causes an increase in bridge impedance, which because of the high current passing through the bridge in its superconducting state aids the control line heating in producing the phase transition in the bridge, thus reducing total energy requirements and increasing the switching speed.

Figure 1:
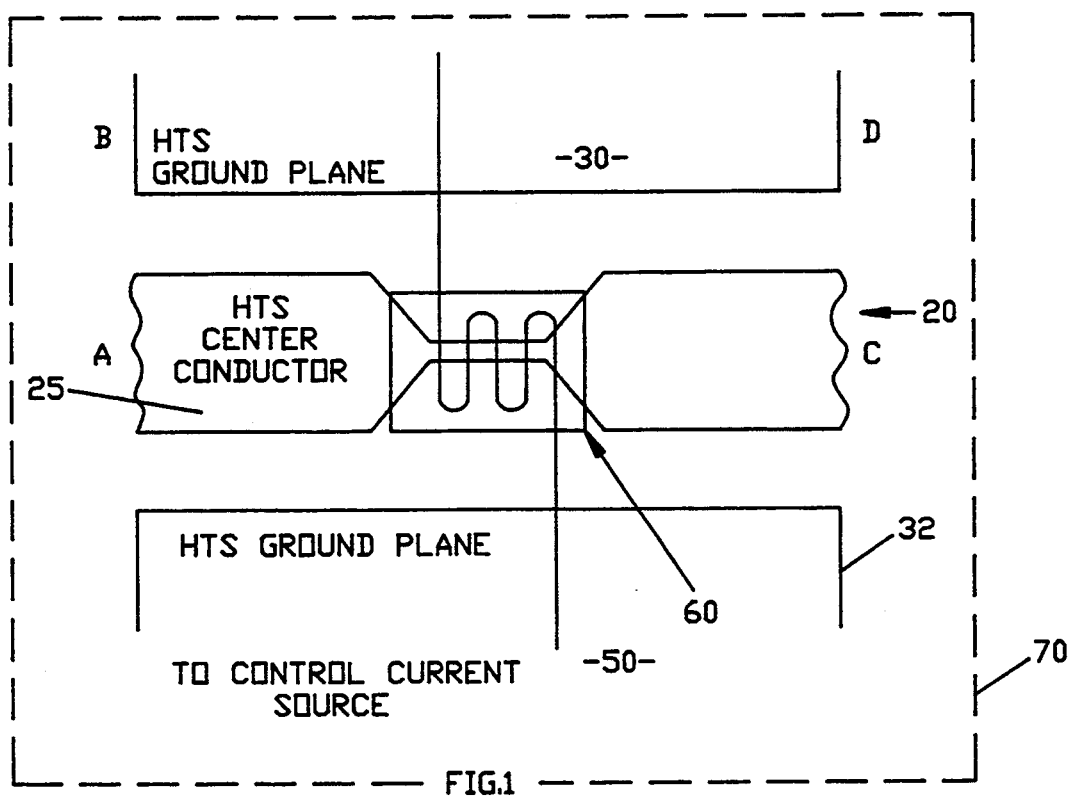
FIG. 1 shows a schematic plan view of a thermal switch in accordance with a preferred embodiment of the invention.
Figure 2:
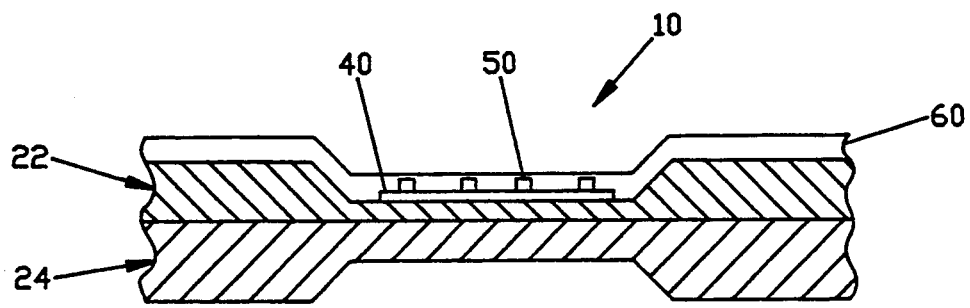
FIG. 2 shows a cutaway view of the switch of FIG. 1.

A layout of an embodiment of the switch of this invention is shown in FIG. 1 and FIG. 2. A 50 $\Omega$ HTS coplanar waveguide 20 may be formed of a TlCaBaCuO base film 22 on a LaAlO$_3$ substrate 24, patterned with standard optical lithography into a center conductor 25 located between and parallel to spaced and electrically connected ground planes 30 and 32. Waveguide 20 is cooled to operating temperature by known cooling means 70, such as physical attachment to a cryogenic cooler or immersion in liquid nitrogen.

The switch is formed as a bridge 10 embedded in center conductor 25 which is driven normal by applied heat as discussed hereinafter. The bridge region is preferably narrowed and thinned to reduce its cross-sectional area relative to the transmission line around it to reduce power requirements for driving the bridge normal by reducing the total heat load in the active area and by allowing flux motion. (See J. Pearl, "Current distribution in superconducting films carrying quantized fluxoids," Appl. Phys. Lett., vol. 5, pp. 65–66: Jul. 1964.) In addition, hot spots can be confined to a small area by keeping the noise low, minimizing insertion loss, and keeping the switch more stable. Etching and thinning are typically done with a wet etchant such as Br/isopropanol solution with concentrations of 2 % for etching and 0.5 % for thinning aqueous EDTA solutions.

The switch further includes an interlevel dielectric, such as hard-baked negative photoresist 40, placed over HTS conductor 25 and a Ti/Au control line 50 formed by lift-off. Control line 50 may be serpentined for increased heat output and magnetic field amplitude. A thermal insulator 60, preferably photoresist or vacuum grease, is then placed over control line 50 in the switch area to reduce power requirements.

An embodiment according to FIG. 1 has been constructed and tested, Bridge 10 of this embodiment was thinned to about 50 nm thickness vs. 300 nm for the transmission line, and had its width reduced to 10 $\mu$m from a width of about 50 $\mu$m, the width of conductor 25. Bridge 10 had a length of about 200 $\mu$m.

Figure 3:
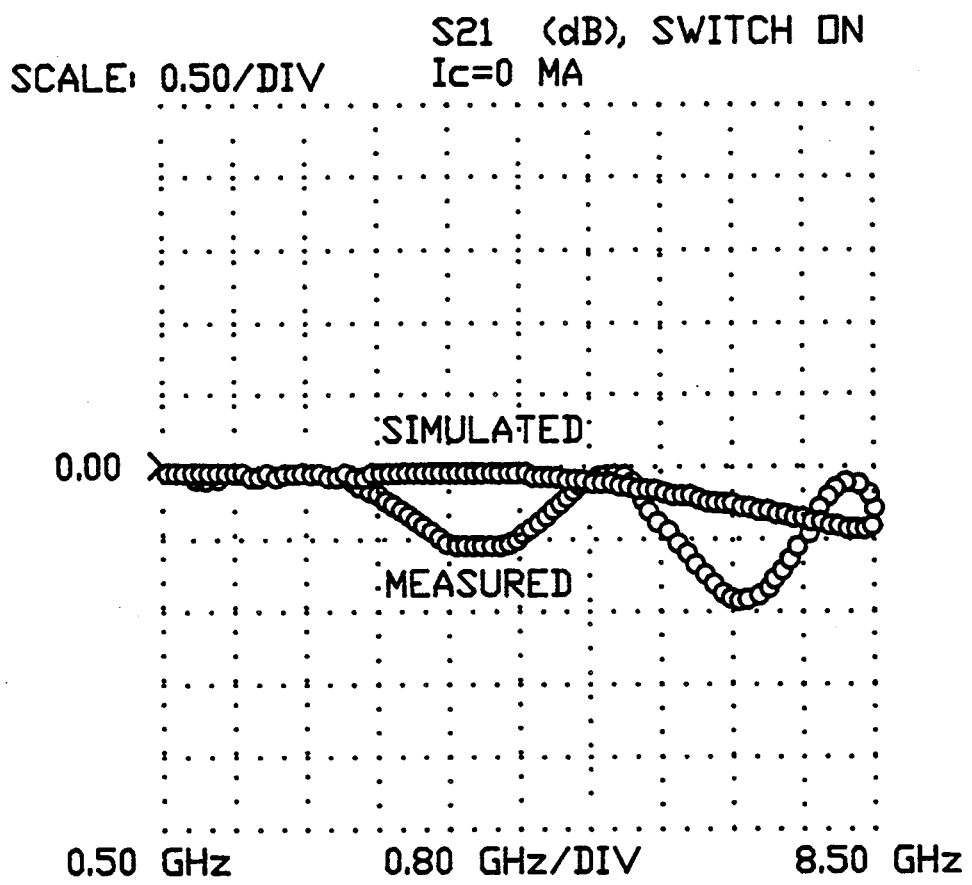
FIG. 3A shows the performance of the switch of FIG. 1 in the ON state.
FIG. 3B shows the performance of the switch of FIG. 1 in the OFF state.
Figure 3:
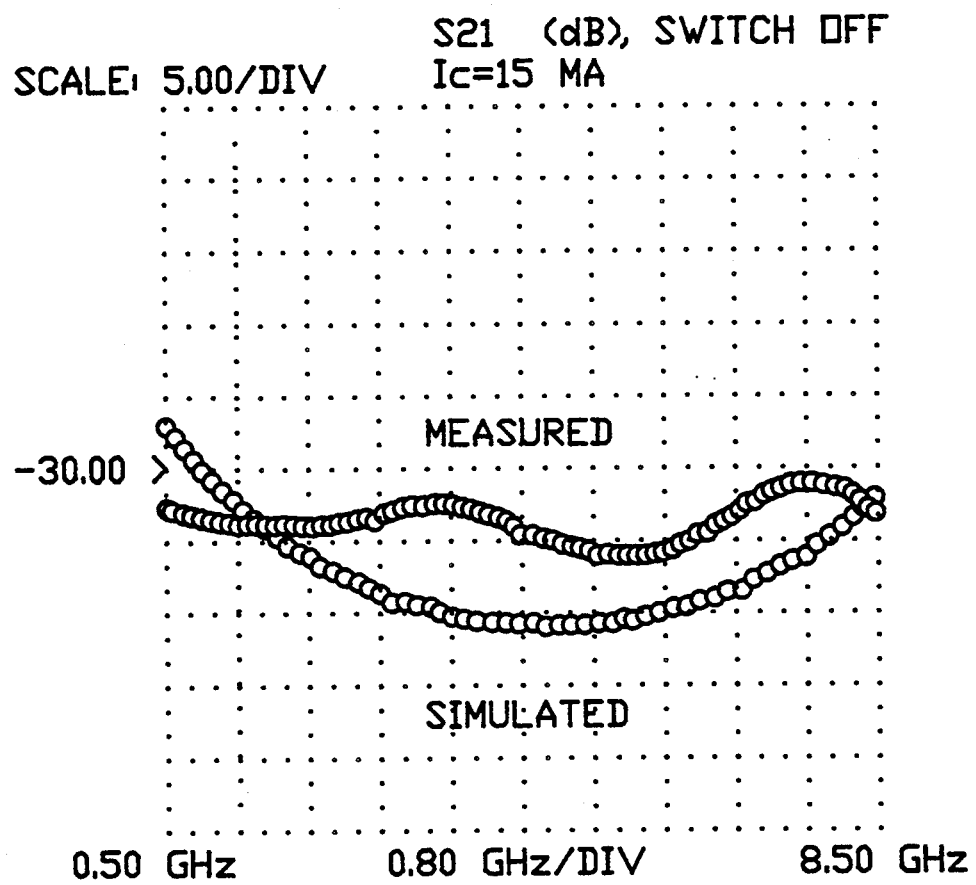

Samples were first characterized by measuring $|S_{21}|$ as a function of control current at 77K, where $|S_{xy}|$ is the magnitude of the x,y element of the S-parameter matrix of the switch. Plots of $|S_{21}|$ with $I_{control}=0$ mA and $I_{control}=15$ mA are shown in FIGS. 3A and 3B. The control current was chosen for quick turn-off and turn-on time. This $I_{control}$ produced enough heat to drive the bridge normal but did not raise the local temperature too high (power dissipation in the control line was about 5 mW). Incident RF power for the data described below was −10 dBm; no performance variations were noted over the available power range of −40 dBm to 0 dBm (although some dependence is certainly expected for higher power levels). The Figures show the very low insertion loss and good matching while in the superconducting (on) state. Isolation of over 30 dB and nearly total reflection ($|S11|=|S22|>-1$ dB across the band in the off-state) of the incident signal are present when the switch is off. Model predictions calculated using film parameters and device geometry are also shown in FIGS. 3A and 3B. The predictions assume the entire bridge goes normal and that the resistivity of the normal bridge was 3.5 $\mu\Omega$-m. This resistivity value was calculated from the film's measured resistivity data and an estimated bridge temperature of 150K. The equilibrium normal bridge temperature was calculated from a simplistic heat transfer model. The circuit model used for the predictions included the above calculated normal state resistance of the bridge, capacitive coupling to the control line, control line inductance, discontinuity models for all of the microstrip transitions and some launch parasitics. Most of the deviations between measured and predicted values are due to incomplete launch modeling and relatively poor fixturing.

Figure 4:
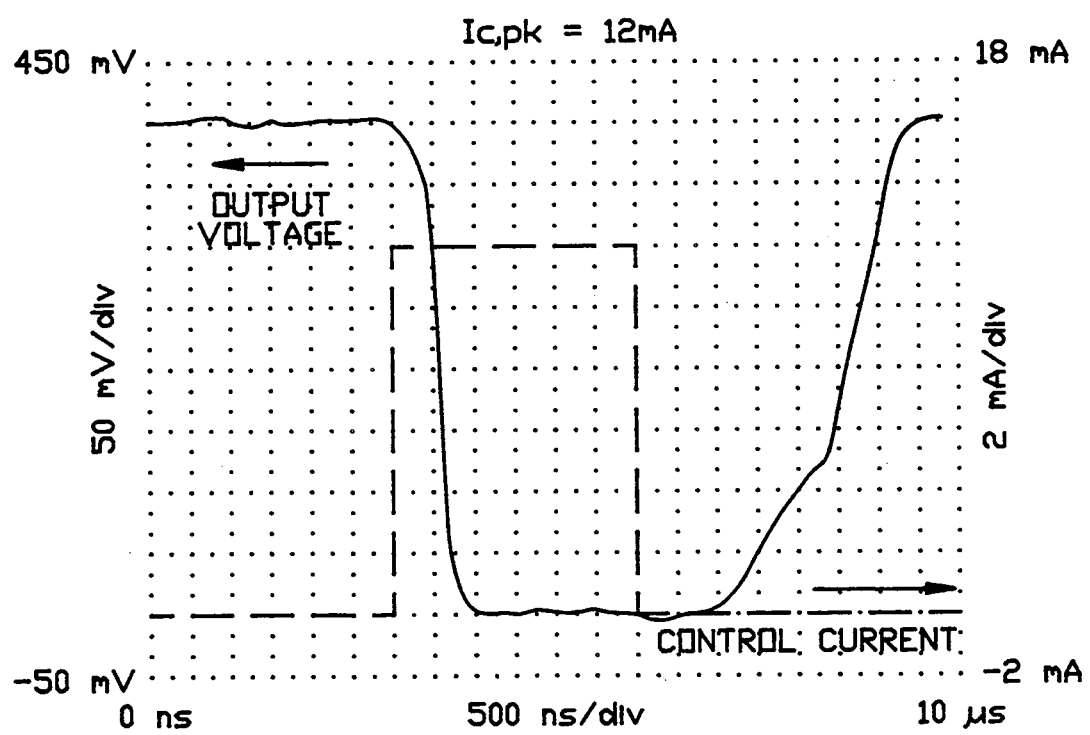
FIGS. 4A and 4B show the time response of the thermal switch to high and low drive currents.
Figure 4:
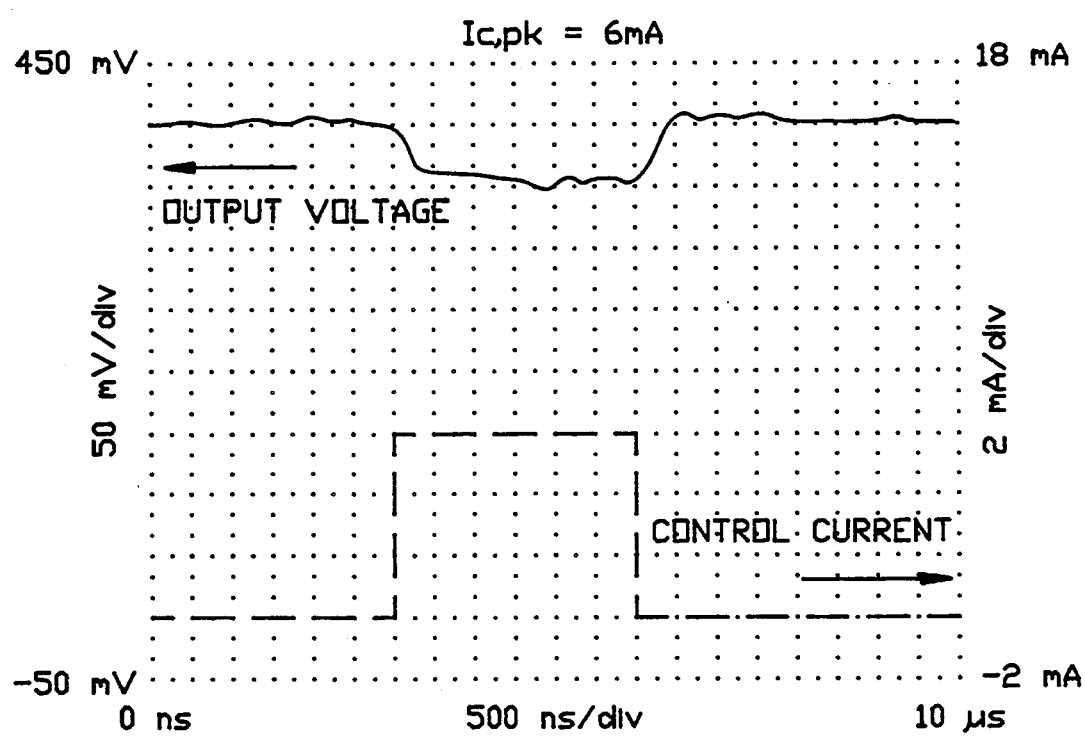

Switching time was measured by sending current pulses (amplitude $I_{c,pk}$) through the control line and observing the conduction behavior of the transmission line. A DC signal of 400 mV was applied across AB (see FIG. 1, input of the line) and the output voltage across CD (see FIG. 1) was monitored with an oscilloscope of 50 $\Omega$ input impedance. The results are shown in FIGS. 4(A) and 4(B) (circuit at 77K). For $I_{c,pk}=12$ mA, the switch-off time was $\approx 0.75$ $\mu$s while the switch-on time was $\approx 4$ $\mu$s (FIG. 4a). The difference is likely due to heat storage in the surroundings while the link is being heated. The switch-on time is a function of pulse duty-cycle as would be expected. For $I_{c,pk}=6$ mA, the link appears to enter a mixed state as shown in FIG. 4b. The corresponding insertion loss was measured to be approximately 4 dB across the band and was observed to be stable and repeatable (to within 0.2 dB). This state is potentially attractive for leveling circuits and variable attenuators.

The particular sizes and equipment discussed above are cited merely to illustrate a particular embodiment of this invention. It is contemplated that the use of the invention may involve components having different sizes and shapes as long as the principle, heating a section of HTS conductor to switch it off, is followed. For example, the reductions in mass of the bridge structure would not be necessary if slower switching times caused by slower rate of heating as a result of the additional bridge mass could be tolerated. In addition, other HTS materials could be used for the HTS structure. It is intended that the scope of the invention be defined by the claims appended hereto.

We claim:

1. A high temperature superconducting (HTS) microwave switch comprising:

HTS conductor means for providing a superconducting path for a microwave signal, said means including a switching portion having a reduced cross-sectional area relative to the remainder of said conductor means;

actuation means for controllably heating said portion of said conductor means sufficiently to cause said portion to have normal, and not superconducting, resistivity; and second conductor means spaced from and parallel to said HTS conductor means, said HTS conductor means and said second conductor means comprising a transmission line for said microwave signal;

whereby said switch transmits the signal when said actuation means is not heating said portion, and reflects the signal when said actuation means is heating said portion.

2. The HTS switch of claim 1 wherein said actuation means comprises a normal conducting wire adjacent said portion of said HTS conductor means;

whereby an electric signal through said wire heats said portion.

3. The HTS switch of claim 1 wherein said wire is arranged in a serpentine path across said portion.

4. The HTS switch of claim 3 wherein said wire is separated from said portion by a dielectric layer.

5. The HTS switch of claim 4 wherein said wire and said portion are covered by a thermal insulator.

6. The HTS switch of claim 5 wherein the width of said portion of HTS conductor means is less than the width of said HTS conductor on either side of said portion.

7. The HTS switch of claim 6 wherein the thickness of said portion of HTS conductor means is less than the thickness of said HTS conductor on either side of said portion.

8. The HTS switch of claim 7 wherein said HTS conductor means is on a substrate, the thickness of said substrate at said portion being less than the thickness of said substrate on either side of said portion.

9. The HTS switch of claim 2 wherein said HTS conductor means is on a substrate, the thickness of said substrate at said portion being less than the thickness of said substrate on either side of said portion.

10. The HTS switch of claim 9 wherein the thickness of said portion of HTS conductor means is less than the thickness of said HTS conductor on either side of said portion.

11. The HTS switch of claim 10 wherein said actuation means comprises a normal conducting wire adjacent said portion of said HTS conductor means;
whereby an electric signal through said wire heats said portion.

12. The HTS switch of claim 11 wherein said wire is arranged in a serpentine path across said portion.

13. The HTS switch of claim 12 wherein said wire is separated from said portion by a dielectric layer.

14. The HTS switch of claim 13 further comprising means for cooling said HTS conductor means to approximately 77 K.

15. The HTS switch of claim 1 wherein said second conductor means forms a coplanar waveguide with said HTS conductor means.

16. The HTS switch of claim 9 wherein said second conductor means is on said substrate.

17. The HTS switch of claim 16 wherein said second conductor means forms a coplanar waveguide with said HTS conductor.

* * * * *